(12) United States Patent
Calkins et al.

(10) Patent No.: US 10,325,752 B1
(45) Date of Patent: Jun. 18, 2019

(54) PERFORMANCE EXTRACTION SET

(71) Applicant: Varian Semiconductor Equipment Associates, Inc., Gloucester, MA (US)

(72) Inventors: Adam Moritz Calkins, Newmarket, NH (US); Ernest E. Allen, Jr., Rockport, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 15/937,181

(22) Filed: Mar. 27, 2018

(51) Int. Cl.
| | | |
|---|---|---|
| *H01J 37/05* | (2006.01) | |
| *H01J 37/09* | (2006.01) | |
| *H01J 37/317* | (2006.01) | |
| *H01J 37/08* | (2006.01) | |
| *H01J 37/20* | (2006.01) | |
| *H01L 21/223* | (2006.01) | |

(52) U.S. Cl.
CPC .............. *H01J 37/05* (2013.01); *H01J 37/08* (2013.01); *H01J 37/3171* (2013.01); *H01J 37/20* (2013.01); *H01L 21/2236* (2013.01)

(58) Field of Classification Search
CPC ........ H01J 37/05; H01J 37/08; H01J 37/3171; H01J 37/20; H01L 21/2236
USPC ............ 250/423 R, 424, 492.1, 492.2, 492.3
See application file for complete search history.

(56) References Cited

U.S. PATENT DOCUMENTS

| | | | | |
|---|---|---|---|---|
| 5,808,299 | A * | 9/1998 | Syage ................. | H01J 49/0422 250/282 |
| 7,012,250 | B1 * | 3/2006 | Aksyuk ............... | H01J 49/0018 250/281 |
| 2003/0197129 | A1 * | 10/2003 | Murrell .................. | H01J 27/08 250/423 R |
| 2009/0266997 | A1 * | 10/2009 | Tieger .................. | H01J 27/024 250/396 R |
| 2017/0062185 | A1 * | 3/2017 | Wallace .............. | H01J 37/3244 |

* cited by examiner

*Primary Examiner* — Nicole M Ippolito
(74) *Attorney, Agent, or Firm* — Nields, Lemack & Frame, LLC

(57) ABSTRACT

An extraction set including an extraction plate, a blocker and the holding mechanism for the blocker is disclosed. The extraction set includes an extraction plate that may be constructed of titanium coated with a ceramic material. The extraction plate is attached to the ion source using pins. The extraction plate also includes raised outline in its inner surface which is used to secure the blocker to the inner surface of the extraction plate. The ends of the blocker are secured by two holders disposed on opposite sides of the extraction aperture. The mechanism used for attaching the extraction plate to the ion source also improves the temperature uniformity of the extraction plate.

19 Claims, 10 Drawing Sheets

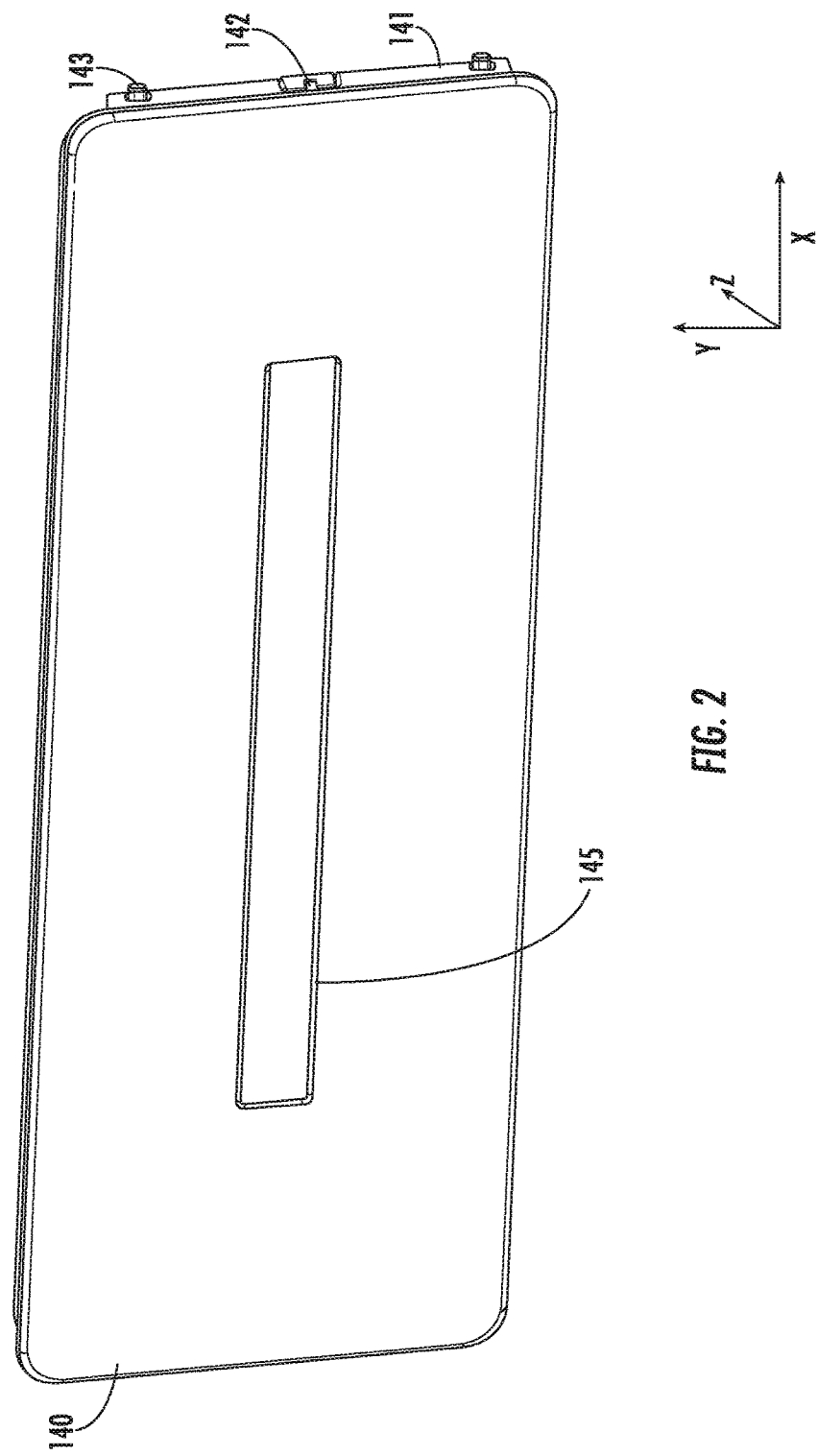

PERFORMANCE EXTRACTION SET

FIELD

Embodiments of the present disclosure relate to extraction sets for systems for wafer processing and more particularly, extraction plates that include a blocker for use with an ion implantation system.

BACKGROUND

Ions are typically implanted in workpieces at a zero incident angle, where a zero incident angle represents an implant that is perpendicular to the surface of the workpiece. However, in certain semiconductor manufacturing processes, it is advantageous for the ions to strike the workpiece at a non-zero incident angle. Typically, ions are extracted from an ion source through an extraction aperture. One technique to extract ions at a non-zero angle is to install a blocker within the ion source near the extraction aperture. The blocker modifies the plasma sheath within the ion source, such that the ions are extracted at non-zero incident angles.

In certain embodiments, the blocker is held in place within the ion source through the use of screws and washers. For example, holes are disposed on either side of the extraction aperture. A fastener passes through the hole and enters a hole in a respective end of the blocker. The fastener is held in place through the use of a clasp, washer or other device. The fastener may be a screw, bolt or other suitable device.

In some cases, the fastener or the clasp may be affected by the plasma and ions within the ion source. For example, material from these components may be sputtered and subsequently enter the extracted ion beam and be accelerated toward the workpiece.

Therefore, it would be beneficial if there were a system for holding the blocker in place that did not cause contamination of the ion beam. Further, it would be advantageous if the system exhibited improved thermal characteristics.

SUMMARY

An extraction set including an extraction plate, a blocker and the holding mechanism for the blocker is disclosed. The extraction set includes an extraction plate that may be constructed for titanium coated with a ceramic material. The extraction plate is attached to the ion source using pins. The extraction plate also includes raised outline in its inner surface which is used to secure the blocker to the inner surface of the extraction plate. The ends of the blocker are secured by two holders disposed on opposite sides of the extraction aperture. The mechanism used for attaching the extraction plate to the ion source also improves the temperature uniformity of the extraction plate.

According to one embodiment, an extraction plate for use with a workpiece processing system is disclosed. The extraction plate comprises a plate, having a front surface and a rear surface adapted to be attached to an ion source chamber, the plate having an extraction aperture having a width and a height; a blocker disposed proximate the extraction plate, having two ends, wherein the two ends are held in place at a respective attachment point disposed on either side of the extraction aperture in a width direction on the rear surface; and a blocker holder affixed to the rear surface of the plate and covering the two ends of the blocker. In certain embodiments, each attachment point comprises two guide rails extending away from the rear surface and extending in the width direction, the two guide rails each having a hole passing therethrough, and each hole in the two guide rails is aligned with a corresponding hole in a respective side of the blocker holder, wherein a pin passes through the hole in the blocker holder and the respective hole in the two guide rails to hold the blocker holder in place. In certain embodiments, each of the two ends of the blocker terminates in two prongs having an opening therebetween, and a projection is disposed proximate the attachment point, such that the projection fills the opening in a respective end of the blocker and serves to align the blocker to the plate. In certain embodiments, each of the two ends of the blocker have an enclosed aperture, and a projection is disposed proximate the attachment point, such that the projection fills the enclosed aperture in a respective end of the blocker and serves to align the blocker to the plate. In certain embodiments, a compressive device is disposed between the blocker holder and the blocker to push the blocker toward the plate.

According to another embodiment, an extraction set for attachment to an ion source chamber is disclosed. The extraction set comprises an extraction plate with an extraction aperture, having a front surface facing away from the ion source chamber, comprising two sidewalls extending away from the front surface, the two sidewalls each having a hole; a mounting frame having raised sidewalls, the raised sidewalls each having a hole; and a plurality of pins, each pin passing through the hole in a respective sidewall and a respective hole in the mounting frame to affix the extraction plate to the mounting frame. In certain embodiments, an O-ring is disposed between the mounting frame and the extraction plate to create thermal isolation between the mounting frame and the extraction plate. In certain embodiments, the raised sidewalls of the extraction plate each comprise an alignment tab, and the raised sidewalls of the mounting frame each comprise an alignment feature, wherein the alignment tab is used to align the extraction plate to the mounting frame. In certain embodiments, the extraction set further comprises a blocker disposed proximate the extraction plate, having two ends, wherein the two ends are held in place by attachment points disposed on either side of the extraction aperture in a width direction on a rear surface; and a blocker holder affixed to the rear surface of the extraction plate and covering the two ends of the blocker.

According to another embodiment, a workpiece processing system is disclosed. The workpiece processing system comprises an ion source chamber, comprising a plurality of chamber walls and an extraction plate with an extraction aperture; wherein the extraction plate has a front surface facing away from the ion source chamber and a rear surface disposed in the ion source chamber, and wherein the front surface is devoid of any attachment components. In certain embodiments, the extraction plate comprises two sidewalls extending away from the front surface, the two sidewalls each having a hole. In certain embodiments, the workpiece processing system further comprises a mating component having raised sidewalls, the raised sidewalls each having a hole, and a plurality of pins, each pin passing through the hole in a sidewall and a respective hole in the mating component. In certain embodiments, an ion source housing surrounds at least a portion of the ion source chamber, and wherein a mounting frame is attached to the ion source housing and the mounting frame is the mating component. In other embodiments, an ion source housing surrounds at least a portion of the ion source chamber, wherein the ion source housing is the mating component.

BRIEF DESCRIPTION OF THE FIGURES

For a better understanding of the present disclosure, reference is made to the accompanying drawings, which are incorporated herein by reference and in which:

FIG. 2 is a front view of the extraction plate according to one embodiment;

DETAILED DESCRIPTION

Figure 1:
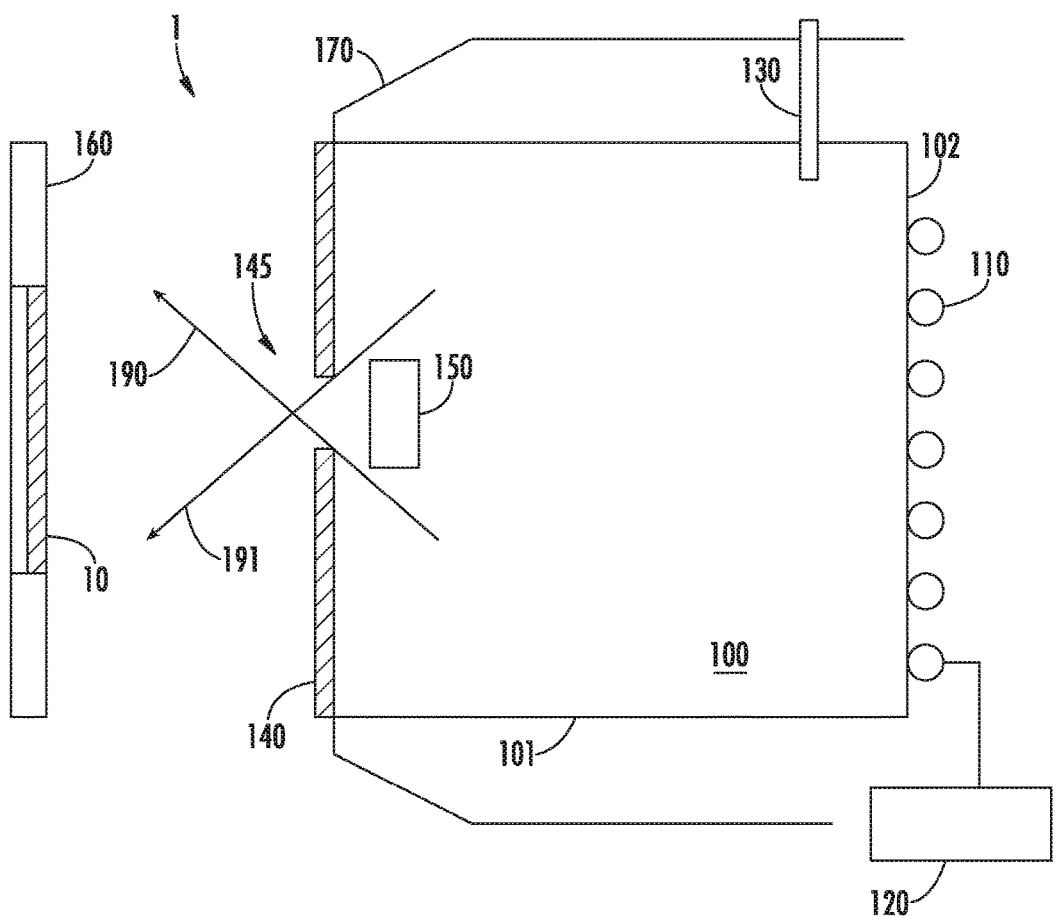
FIG. 1 is a view of the ion source that utilizes the extraction set according to one embodiment.

As described above, a blocker may be disposed within an ion source chamber to cause the ions to be extracted at non-zero angles. The blocker is often attached to the extraction plate so as to be held in place. FIG. 1 shows an embodiment of a system that employs a blocker.

The system 1 includes an ion source chamber 100, comprised of a plurality of chamber walls 101. In certain embodiments, one or more of these chamber walls 101 may be constructed of a dielectric material, such as quartz. An RF antenna 110 may be disposed on an exterior surface of a first dielectric wall 102. The RF antenna 110 may be powered by a RF power supply 120. The energy delivered to the RF antenna 110 is radiated within the ion source chamber 100 to ionize a feed gas, which is introduced via gas inlet 130. In other embodiments, the gas is ionized in a different manner, such as through the use of an indirectly heated cathode (IHC), a capacitively coupled plasma source, an inductively coupled plasma source, a Bernas source or any other plasma generator.

One chamber wall, referred to as the extraction plate 140 includes an extraction aperture 145 through which ions may exit the ion source chamber 100. The extraction plate 140 may be constructed of an electrically conductive material, such as titanium, tantalum or another metal. A front view of the extraction plate 140 is shown in FIG. 2. The extraction plate 140 may be in excess of 300 millimeters in width. Further, the extraction aperture 145 may be wider than the diameter of the workpiece 10.

In certain embodiments, an ion source housing 170 may be disposed to cover all or a portion of the chamber walls 101. The ion source housing 170 may surround a portion of the ion source chamber, but may have an opening on its front face. In some embodiments, the extraction plate 140 may be secured to the ion source housing 170 on the front face.

Disposed within the ion source chamber 100 may be a blocker 150. The blocker 150 may be a dielectric material that is used to affect the plasma sheath in the vicinity of the extraction aperture 145. In other embodiments, the blocker 150 may be a metal coated with a dielectric material, such as a ceramic material. For example, in certain embodiments, the blocker 150 is disposed such that the ions exit the extraction aperture 145 at an extraction angle that is not perpendicular to the workpiece 10. In certain embodiments, ions may be extracted at two different extraction angles, such as is shown in FIG. 1. In this embodiment, a first beamlet 190 and a second beamlet 191 are directed toward the workpiece 10. In other embodiments, the ions are extracted at a single extraction angle. The placement of the blocker 150 within the ion source chamber 100 relative to the extraction aperture 145 defines the angle at which the ions exit the ion source chamber 100 and impact the workpiece 10. The blocker 150 may be attached to the rear side of the extraction plate 140, as described in more detail below.

A platen 160 is disposed outside the ion source chamber 100 proximate the extraction aperture 145. The workpiece 10 is disposed on the platen 160.

FIG. 2 shows a front view of the extraction plate 140. The extraction plate 140 is typically much longer in the width direction than in the height direction. Throughout this disclosure, the width direction is defined as the X direction, the height direction is defined as the Y direction, and the thickness direction is defined as the Z direction. In this disclosure, the longer edges may be referred to as the top and bottom edges of the extraction plate 140. The shorter edges may be referred to as the shorter sides or simply the sides of the extraction plate 140. The extraction plate 140 includes an extraction aperture 145. Like the extraction plate 140, the extraction aperture 145 is longer in the width direction than in the height direction. The extraction plate 140 may be constructed of titanium, which is coated with a ceramic material. The ceramic material may be yttria, alumina, silica, or any other suitable material. The front surface of the extraction plate 140 may be flat, with sidewalls 141 extending away from the front surface from the two shorter sides. Throughout this disclosure, the front surface of the extraction plate 140 refers to the surface that faces away from the ion source chamber 100. The rear surface of the extraction plate 140 is the surface that is disposed within the ion source chamber 100.

Figure 3A:
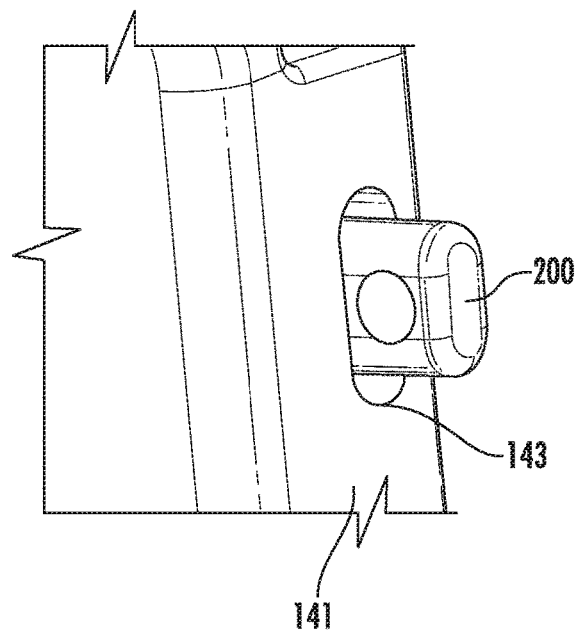
FIG. 3A shows an enlarged view of the pins used to secure the extraction plate.
Figure 3B:
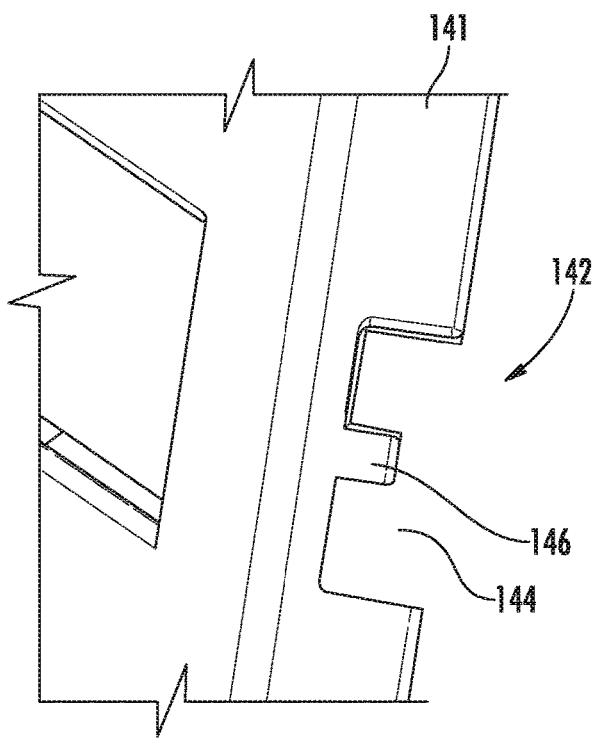
FIG. 3B shows an enlarged view of the alignment tab used to secure the extraction plate to the mating component.

FIGS. 3A and 3B show enlarged views of the features disposed on these sidewalls 141. These sidewalls 141 extend sufficiently far away from the front surface to allow holes 143 to be disposed in each sidewall 141. In certain embodiments, the sidewalls 141 may be at least 0.5 inches tall, although other dimensions are within the scope of the disclosure. As will be described later, mounting pins 200 are inserted through these holes 143. Additionally, one or more alignment tabs 142 may be disposed on each sidewall 141. The alignment tab 142 may include a recessed region 144 having one or more protrusions 146 extending outward into the recessed region 144. The recessed region 144 may be the same height as the sidewall 141, or may be a fraction of the total height of the sidewall 141. The width of the alignment tab 142 is not limited by this disclosure. The alignment tab 142 mates with a corresponding alignment feature in the mating component. While the figures show a single protrusion 146 in each recessed region 144, the disclosure is not limited to this embodiment.

While FIG. 2 shows the sidewalls 141 disposed on the shorter sides, in other embodiments, the sidewalls may be disposed on the top and bottom edges of the extraction plate 140.

Figure 4:
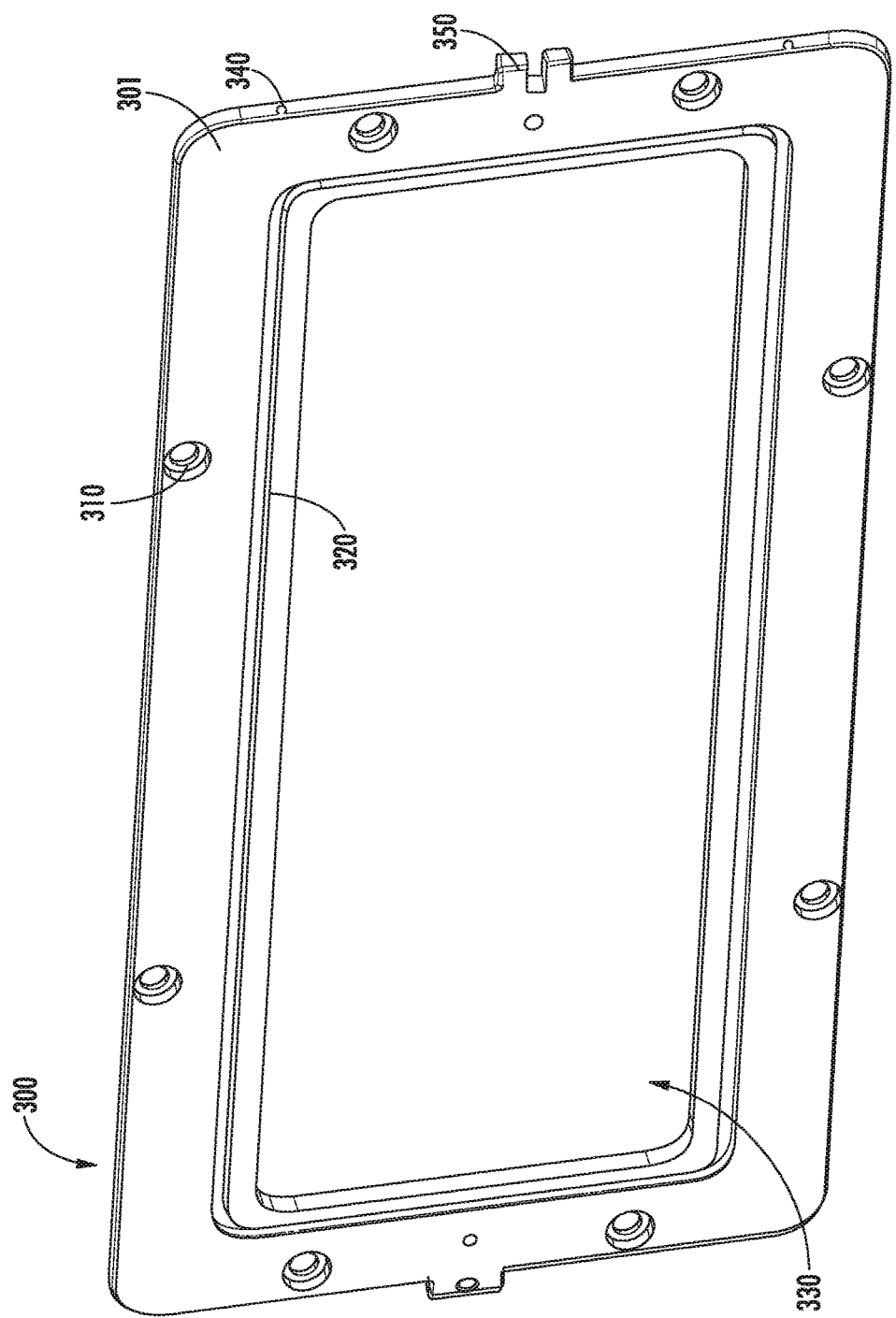
FIG. 4 shows a mounting frame that may be used as the mating component in one embodiment.
Figure 5:
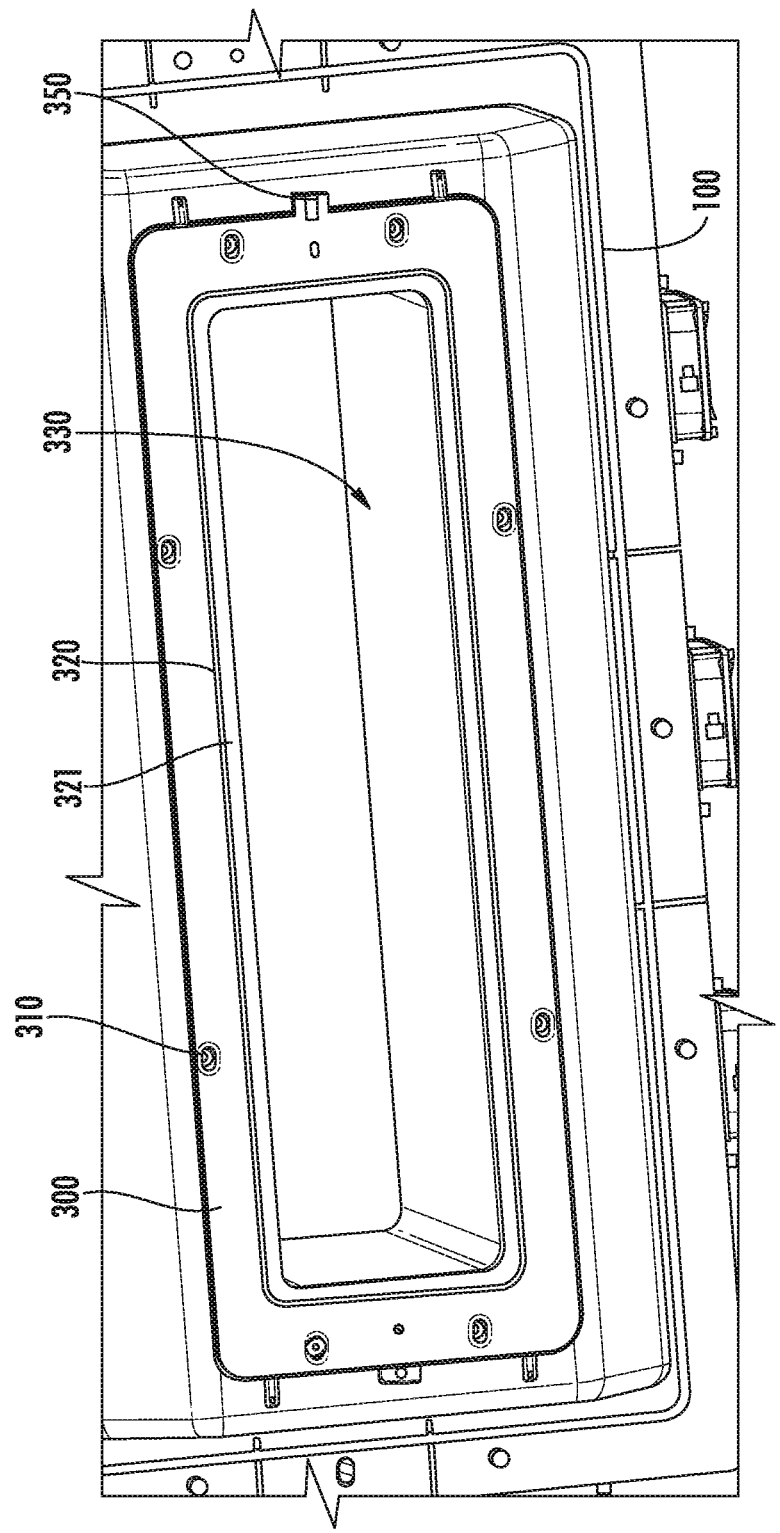
FIG. 5 shows the mounting frame secured to the ion source housing.

FIG. 4 shows a first embodiment of a mating component for the extraction plate 140. This mating component may be a mounting frame 300. The mounting frame 300 comprises a plurality of holes 310 located on the front surface 301 which allow the mounting frame 300 to be affixed to the ion source housing 170, as shown in FIG. 5. The mounting frame 300 may allow include a groove 320 on its front surface 301. An O-ring 321 may be disposed in this groove 320 to create thermal isolation between the mounting frame 300 and the extraction plate 140. The O-ring 321 may also help create a tight seal between the rear surface of the extraction plate 140 and the front surface of the mounting frame 300. The mounting frame 300 also includes a hollow center portion 330 which has a width that is wider than the width of the extraction aperture 145, and a height that is at least as tall as the height of the extraction aperture 145. In other embodiments, the hollow center portion 330 is sized so as not to extend into the ion source chamber 100. The mounting frame 300 may be constructed of any suitable material, such as titanium coated with a ceramic material. The mounting frame 300 also has a minimum thickness such that when mounting pins 200 are inserted through the holes 143, the mounting pins 200 contact the sides of the mounting frame 300. In certain embodiments, holes 340 are provided in the sides of the mounting frame 300 to accept the mounting pins 200. The mounting frame 300 may also include an alignment feature 350 on its shorter sides to mate with the alignment tab 142 on the extraction plate 140. The alignment feature 350 may include two spaced apart extending portions, which mate with the protrusion 146 and the recessed region 144 of the alignment tab 142. In other embodiments, the alignment tab 142 and the alignment feature 350 are not provided. Rather, the extraction plate 140 is aligned using the mounting pins 200 and the holes 340 in the sides of the mounting frame 300.

The mounting pins 200 may be made of any suitable material, such as anodized titanium.

The mounting pins 200 are held in place due to friction. The O-ring 321 tends to push the extraction plate 140 away from the mounting frame 300. This exerts a force on the mounting pins 200 which tends to hold them in their respective holes 340.

In another embodiment, the sidewalls 141 of the extraction plate 140 are disposed along the top and bottom edges. In this embodiment, the alignment feature 350 would likewise be disposed on the top and bottom edges of the mounting frame 300. In this embodiment, the mounting pins 200 may be held captive to resist the force of gravity.

Figure 6:
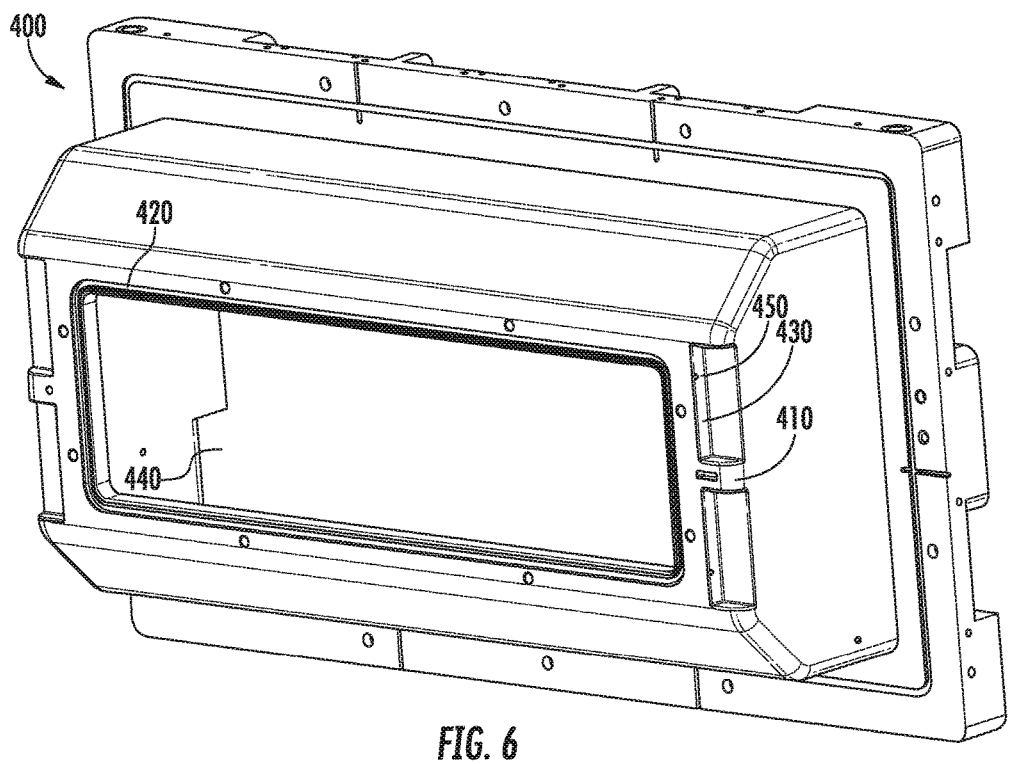
FIG. 6 shows a modified ion source housing that serves as the mating component for the extraction plate according to one embodiment.

FIG. 6 shows another mating component. In this embodiment, the features described above with respect to the mounting frame 300 have been integrated directly into a modified ion source housing 400. The modified ion source housing 400 may be constructed from a hard coat anodized aluminum, or another suitable material. Specifically, the front face of the modified ion source housing 400 may comprise an alignment feature 410 on each of the shorter sides. In this figure, the shorter sides refer to the sides adjacent to the shorter edges of the hollow portion 440. In other embodiments, the alignment tab 142 and the alignment feature 410 are not provided. Rather, the extraction plate 140 is aligned using the mounting pins 200 and holes 450 in the sides of the modified ion source housing 400. The front face of the modified ion source housing 400 also includes a groove 420 that surrounds the hollow portion 440 in which an O-ring may be disposed. Finally, the front face of the modified ion source housing 400 is designed so as to have sidewalls 430. As was explained above, the mounting pins 200 pass through holes 143 in the extraction plate 140 and enter holes 450 disposed in the sidewalls 430 of the modified ion source housing 400. As described above, the O-ring causes force to be applied to the mounting pins 200 which tends to hold them in place.

In another embodiment, the sidewalls 141 of the extraction plate 140 are disposed along the top and bottom edges. In this embodiment, the alignment feature 410 would likewise be disposed on the top and bottom edges of the modified ion source housing 400. In this embodiment, the mounting pins 200 may be held captive to resist the force of gravity.

Figure 7:
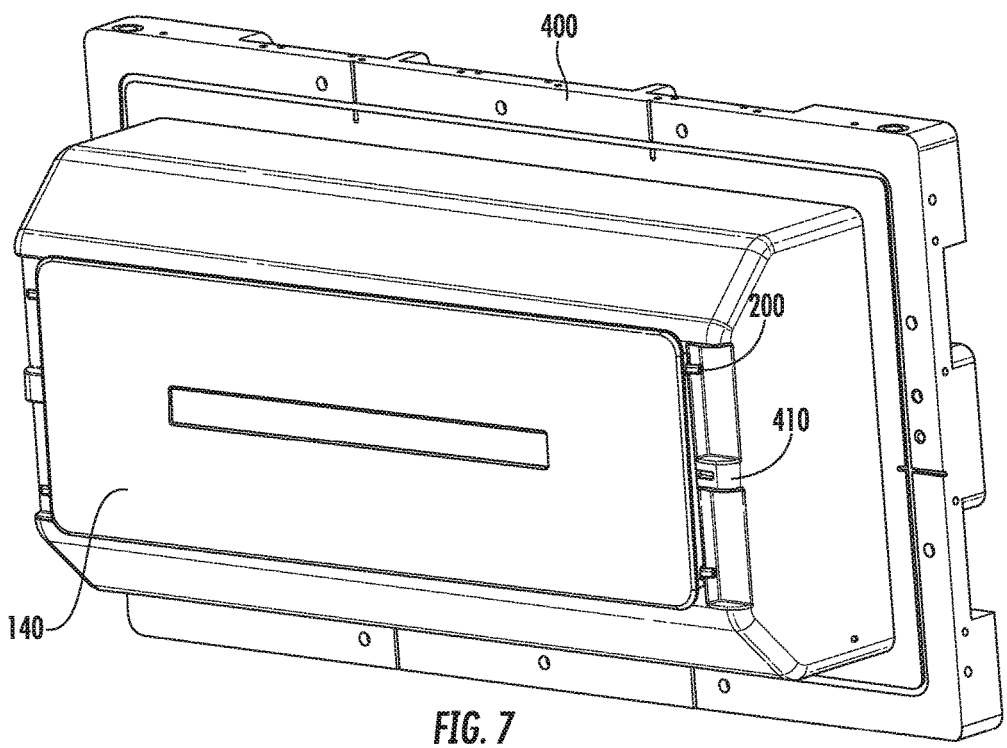
FIG. 7 shows the extraction plate secured to the modified ion source housing.

FIG. 7 shows the extraction plate 140 attached to the modified ion source housing 400. Mounting pins 200 are inserted through the holes 143 in the sidewalls 141 of the extraction plate 140 and contact the sidewalls 430 of the modified ion source housing 400. The alignment tab 142 of the extraction plate 140 mates with the alignment feature 410 of the modified ion source housing 400 to align the extraction plate 140 in the height and width directions.

In the embodiments of FIG. 5 and FIG. 7, the mounting pins 200 secure the extraction plate 140 to its mating component, which may be a mounting frame 300 or a modified ion source housing 400. The O-ring 321 is compressed between the mating component and the extraction plate 140, serving to create thermal isolation between the mating component and the extraction plate 140. The O-ring 321 may also provide a seal between the mating component and the extraction plate 140 so as to reduce leakage. As noted above, the extraction plate 140 may be constructed of titanium or another suitable metal and may be coated with a suitable material, such as a ceramic material. Further, as is seen best in FIG. 7, the front surface of the extraction plate 140 is planar and is devoid any attachment components that may typically be used to attach the extraction plate 140 to the ion source chamber 100, such as washers, fasteners, or bolts. Consequently, the amount of contamination that is introduced into the ion beam by the extraction plate 140 is significantly reduced. This reduction is particular relevant to systems where mass analysis is not performed prior to subjecting the workpiece 10 to the ions extraction from the ion source chamber 100.

Figure 8:
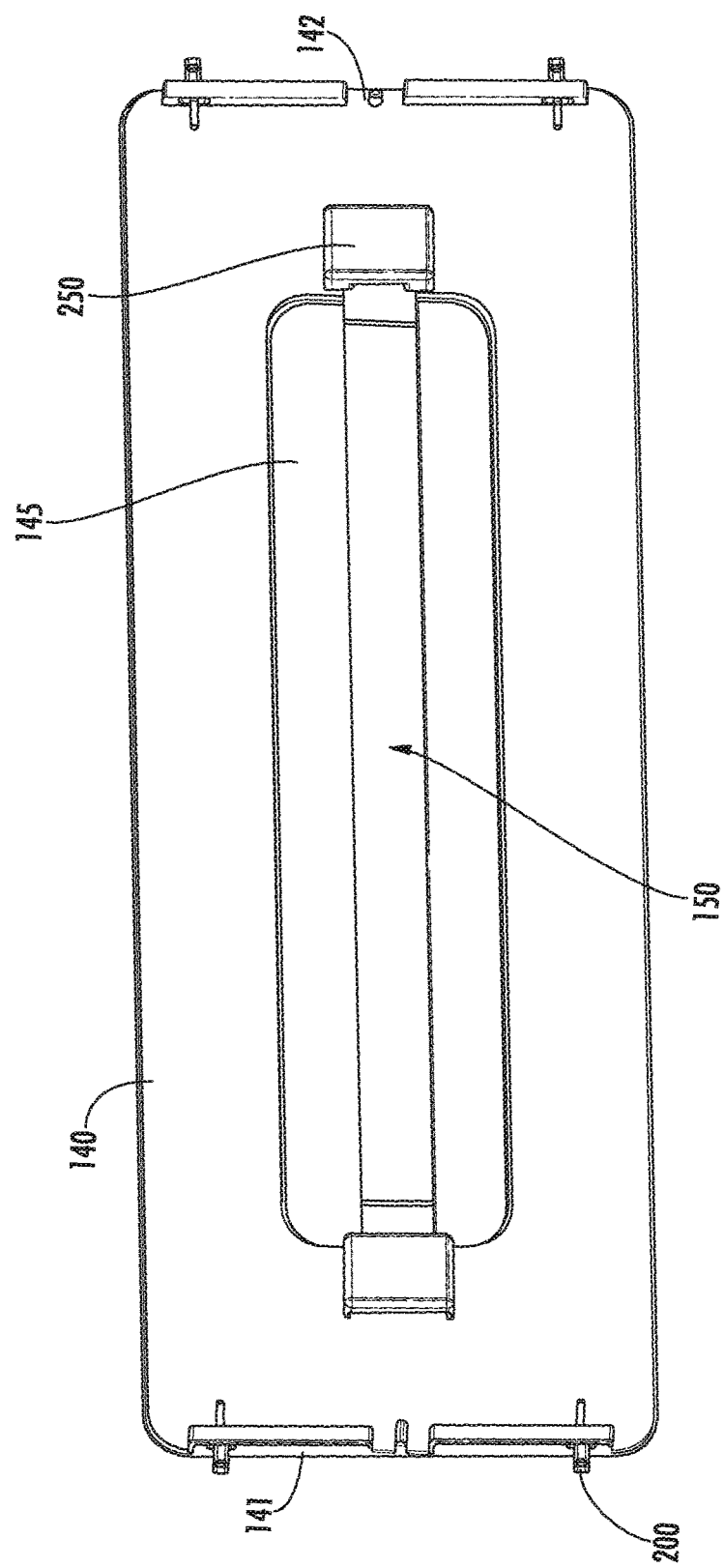
FIG. 8 shows a rear view of the extraction plate of FIG. 2 with the attached blocker.

In certain embodiments, the extraction plate 140 is also adapted to support a blocker 150 that is disposed within the ion source chamber 100. FIG. 8 shows the rear surface of the extraction plate 140 with the attached blocker 150 according to one embodiment. The sidewalls 141 can be seen with mounting pins 200 inserted in the holes 143. The alignment tabs 142 are also shown on the rear surface. The blocker 150 extends across the long dimension of the extraction aperture 145 and attaches to the extraction plate 140 at opposite sides of the extraction aperture 145. The regions at which the blocker 150 attaches to the extraction plate 140 are referred to as attachment points. The shorter edges of the extraction aperture 145 are referred to as the sides of the extraction aperture 145, while the longer edges are referred to as the top and bottom edges of the extraction aperture. Blocker holders 250 are disposed on either side of the extraction aperture 145 to secure the blocker 150 in place. The blocker 150 may be constructed of a single piece of titanium or another metal, and coated with a ceramic material.

Figure 9:
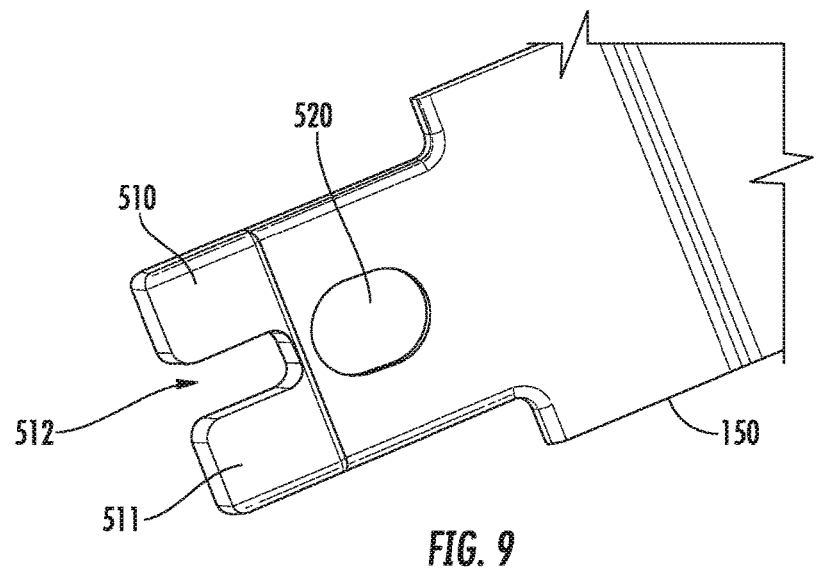
FIG. 9 shows one end of the blocker according to one embodiment.

FIG. 9 shows the end of the blocker 150 according to one embodiment. In this embodiment, each end of the blocker 150 terminates in two prongs 510, 511. Each end of the blocker 150 may also include an indentation 520 on at least one surface. The space between the two prongs 510,511 defines an opening 512. In other embodiments, the ends of the blocker 150 may include an enclosed aperture rather than an opening 512.

Figure 10:
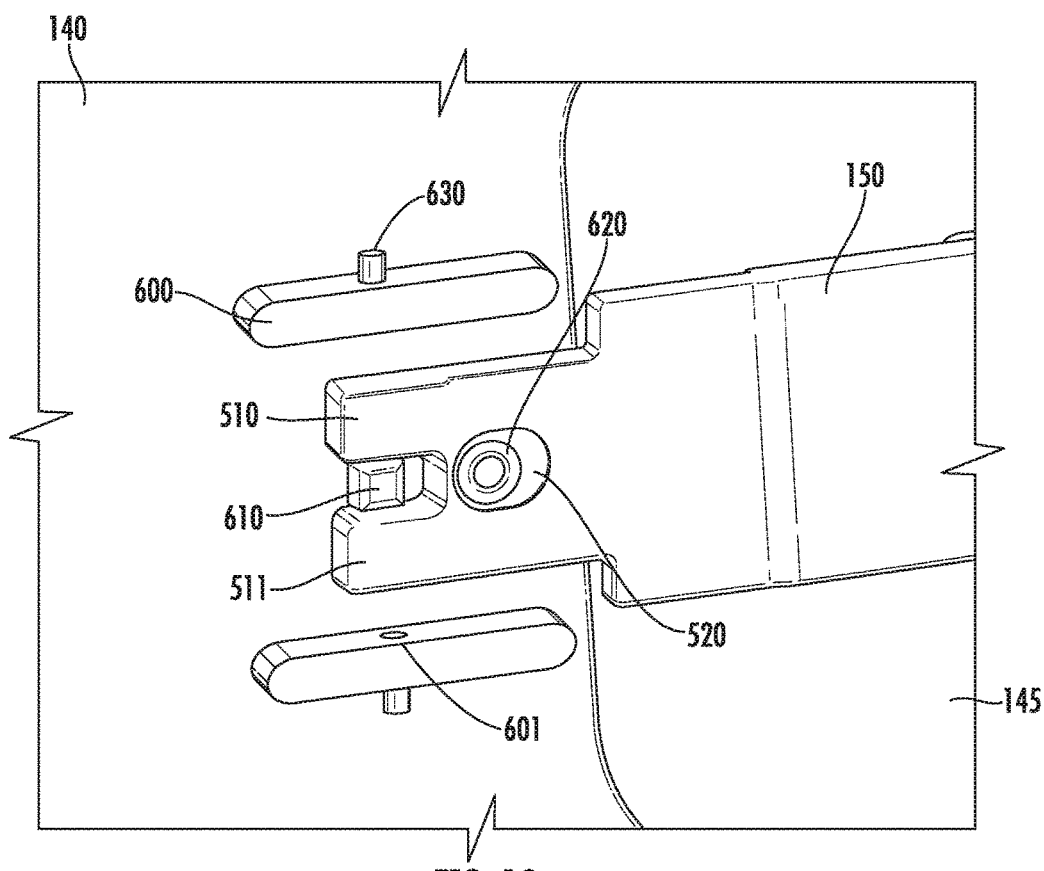
FIG. 10 shows the configuration of the extraction plate and the blocker near the attachment point.

FIG. 10 shows the end of the blocker 150 when it is disposed on the rear surface of the extraction plate 140 near the attachment point. As noted above, the attachment points are regions located on either side of the extraction aperture 145. The rear surface of the extraction plate 140 comprises two raised guide rails 600 near each attachment point. The raised guide rails 600 extend away from the rear surface of the extraction plate 140 in the thickness direction and extend in the width direction. The raised guide rails 600 are spaced apart in the height direction by a distance equal to or greater than the width of the end of the blocker 150, such that the end of the blocker 150 can be seated between the two raised guide rails 600. A projection 610 may be disposed on the rear surface of the extraction plate 140 between each pair of raised guide rails 600. As shown in FIG. 10, the dimension of the projection 610 in the height direction is approximately the same as the width of the opening 512 in the blocker 150. Thus, the projection 610 serves to align the blocker 150 on either side of the extraction aperture 145. As noted above, the opening 512 may be replaced with an enclosed aperture that surrounds the projection 610. A compressive device 620, such as a metallic spring, a non-metallic spring or an elastic washer, may be disposed on the indentation 520. There may be an indentation 520 on both sides of the blocker 150. In certain embodiments, a compressive device 620 is disposed on both sides of the blocker 150. This compressive device 620 serves to hold the blocker 150 securely in place when the blocker holders 250 are attached. As will be described in more detail below, the blocker holders 250 are secured using pins 630. The raised guide rails 600 may each have at least one hole 601 that passes in the height direction through the raised guide rails 600. The hole 601 is dimensioned to accommodate the pin 630.

Figure 11:
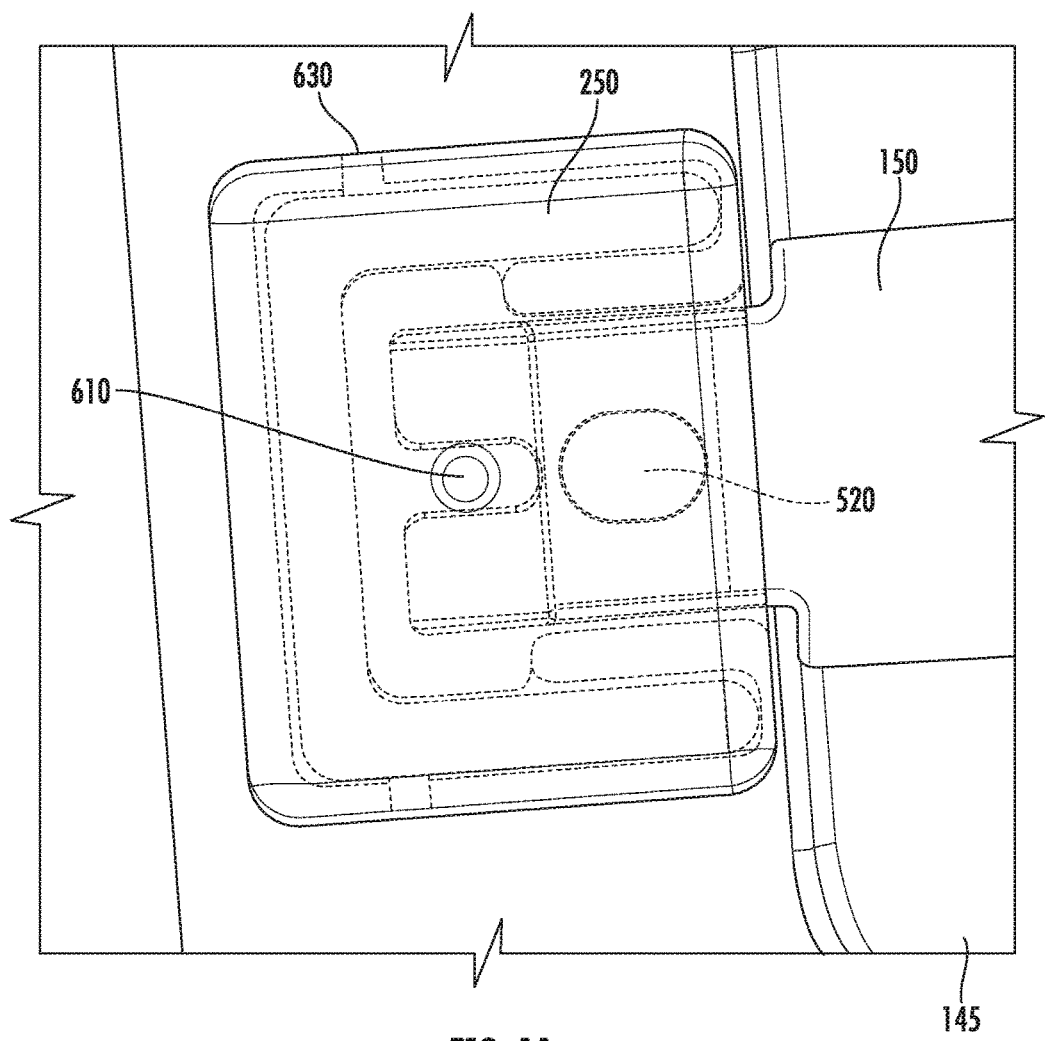
FIG. 11 shows the blocker holder affixed to the extraction plate to hold the blocker in place.
Figure 12A:
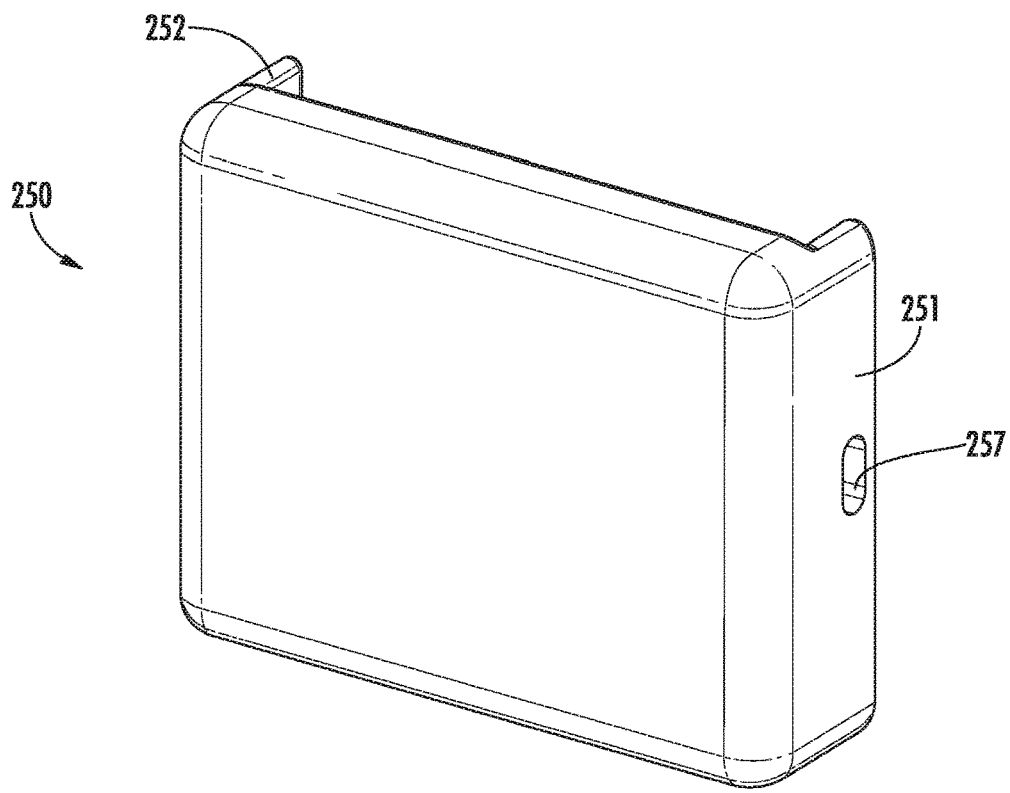
FIGS. 12A-12B show top and bottom views of the blocker holder, respectively.
Figure 12B:
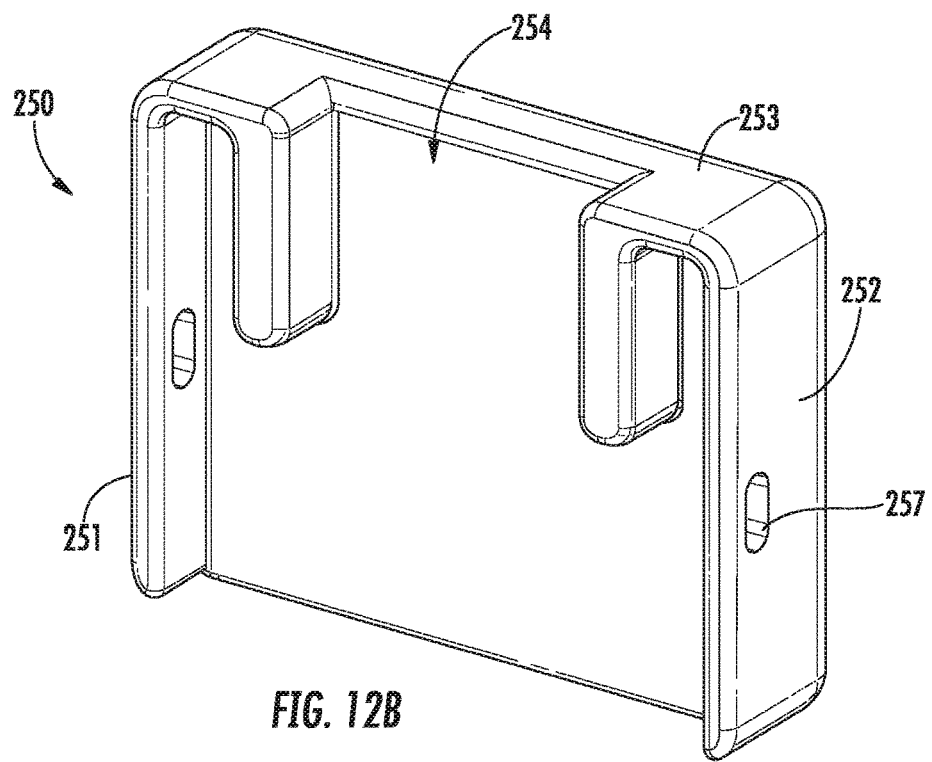

FIG. 11 shows the blocker holder 250 installed over the end of the blocker 150. FIGS. 12A-12B show top and bottom views of the blocker holder 250, respectively. The blocker holder 250 may be constructed of a suitable material, such as a metal, like titanium. The blocker holder 250 may also be coated with a ceramic material. The blocker holder 250 is dimensioned so as to be wider than the space between the two raised guide rails 600 in the height direction. In this way, the blocker holder 250 can be pressed against the rear surface of the extraction plate 140 and cover the raised guide rails 600 and the projection 610. The blocker holder 250 may be formed so as to press against the rear surface of the extraction plate 140 on at least two sides 251, 252; the two sides proximate the raised guide rails 600. In certain embodiments, the blocker holder 250 may be formed so that the side furthest from the extraction aperture 145 also contacts the extraction plate 140. The blocker holder 250 may have an opening 254 on the fourth side 253 to allow the blocker 150 to be received. In certain embodiments, the opening 254 on the fourth side 253 is dimensioned to be less than 0.06 inches larger than the width of the blocker 150 to minimize the gap between the blocker 150 and the blocker holder 250. While held in place, pins 630 are pressed through holes 257 in the blocker holder 250, which are aligned with holes in the raised guide rails 600. In this way, the pins 630 pass through both the holes 257 in the blocker holder 250 and the raised guide rails 600 and secure the blocker holder 250 in place. The pins 630 may be constructed of polyamid or another suitable material. The compressive device 620 is disposed between the blocker 150 and the blocker holder 250, and may be disposed in the indentation 520 to facilitate its placement. This compressive device 620 serves to press the blocker 150 against the extraction plate 140. When assembled, the rear surface of the extraction plate 140 appears as shown in FIG. 8. Note that no fasteners are visible and the attachment of the blocker 150 to the extraction plate 140 is completely hidden by the blocker holder 250. In contrast, the prior art relies on metallic springs to press the blocker against the extraction plate 140. These metallic springs may contaminate the ion beam. This issue is eliminated with the present system.

In certain embodiments, an extraction plate 140 may attach to the ion source housing 170 as shown in FIG. 5 or FIG. 7. The extraction plate 140 may also support the blocker 150 in the manner shown in FIGS. 8-11. In other embodiments, the extraction plate 140 may also have only one of these two features. In other words, the extraction plate 140 may secure the blocker 150 in the manner shown in FIGS. 8-11, and connect to the ion source housing 170 in a different manner. Alternatively, the extraction plate 140 may be secured to the ion source housing 170 in the manner shown in FIG. 5 or FIG. 7, and support the blocker 150 in a different manner.

The system described herein has many advantages. First, the number of particles that are generated during operation is significantly reduced by removing all components from the front surface of the extraction plate 140. In certain embodiments, as shown in FIG. 2 and in FIG. 5, the front surface of the extraction plate 140 is devoid of any attachment components. The attachments for the blocker are concealed by the blocker holder 250 and the extraction plate 140 attaches to the ion source housing 170 without any fasteners on the front surface of the extraction plate 140. Similarly, in certain embodiments, there are no exposed components on the rear surface of the extraction plate, as shown in FIG. 8. This reduces the number of particles that are introduced into the ion beam due to sputtering of the extraction plate or its associated components.

Additionally, the attachment mechanism described herein also improves the temperature uniformity of the extraction plate 140. Conventionally, extraction plates 140 may be screwed to the ion source housing. This creates areas of very good thermal contact between the ion source housing and the extraction plate, which results in localized hot spots. In contrast, the present extraction plate 140 is attached to the mating component via mounting pins 200 on the sidewalls 141. Further, an O-ring 321 disposed between the mating component and the extraction plate 140 serves to minimize the physical contact between the extraction plate 140 and the mating component. Consequently, a much more uniform temperature profile is achieved. A test was performed to determine the temperature of the extraction plate 140 during normal operation. It was found that the temperature of the extraction plate 140 is consistent across the entirety of the plate, with temperature variations of less than 20 degrees. Furthermore, the attachment of the blocker 150 to the extraction plate 140 also serves to improve the temperature uniformity of the blocker 150. The temperature variation across the entirety of the blocker 150 is less than 10° C. The attachment mechanism reduces contact with cooled components (such as the ion source housing), such that the primary method of heat transfer is radiation, in a high vacuum environment, along the surface of the parts.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An extraction plate for use with a workpiece processing system, comprising:
    a plate, having a front surface and a rear surface adapted to be attached to an ion source chamber, the plate having an extraction aperture having a width and a height;
    a blocker disposed proximate the extraction plate, having two ends, wherein the two ends are held in place at a respective attachment point disposed on either side of the extraction aperture in a width direction on the rear surface; and
    a blocker holder affixed to the rear surface of the plate and covering the two ends of the blocker.

2. The extraction plate of claim 1, wherein each attachment point comprises two guide rails extending away from the rear surface and extending in the width direction, the two guide rails each having a hole passing therethrough, and wherein each hole in the two guide rails is aligned with a corresponding hole in a respective side of the blocker holder, wherein a pin passes through the hole in the blocker holder and the respective hole in the two guide rails to hold the blocker holder in place.

3. The extraction plate of claim 1, wherein each of the two ends of the blocker terminates in two prongs having an opening therebetween, and wherein a projection is disposed proximate the attachment point, such that the projection fills the opening in a respective end of the blocker and serves to align the blocker to the plate.

4. The extraction plate of claim 1, wherein each of the two ends of the blocker have an enclosed aperture, and wherein a projection is disposed proximate the attachment point, such that the projection fills the enclosed aperture in a respective end of the blocker and serves to align the blocker to the plate.

5. The extraction plate of claim 1, further comprising a compressive device disposed between the blocker holder and the blocker to push the blocker toward the plate.

6. An extraction set for attachment to an ion source chamber, comprising:
    an extraction plate with an extraction aperture, having a front surface facing away from the ion source chamber, comprising two sidewalls extending away from the front surface, the two sidewalls each having a hole;
    a mounting frame having raised sidewalls, the raised sidewalls each having a hole; and
    a plurality of pins, each pin passing through the hole in a respective sidewall and a respective hole in the mounting frame to affix the extraction plate to the mounting frame.

7. The extraction set of claim 6, further comprising an O-ring disposed between the mounting frame and the extraction plate to create thermal isolation between the mounting frame and the extraction plate.

8. The extraction set of claim 7, wherein the O-ring pushes the extraction plate away from the mounting frame which holds the plurality of pins in place.

9. The extraction set of claim 6, wherein the raised sidewalls of the extraction plate each comprise an alignment tab, and the raised sidewalls of the mounting frame each comprise an alignment feature, wherein the alignment tab is used to align the extraction plate to the mounting frame.

10. The extraction set of claim 6, further comprising:
    a blocker disposed proximate the extraction plate, having two ends, wherein the two ends are held in place by attachment points disposed on either side of the extraction aperture in a width direction on a rear surface; and
    a blocker holder affixed to the rear surface of the extraction plate and covering the two ends of the blocker.

11. The extraction set of claim 10, wherein each attachment point comprises two guide rails extending away from the rear surface and extending in the width direction, the two guide rails each having a hole passing therethrough, and wherein each hole in the two guide rails aligns with a corresponding hole in a respective side of the blocker holder, wherein a pin passes through the hole in the blocker holder and the respective hole in the two guide rails to hold the blocker holder in place.

12. The extraction set of claim 10, further comprising a compressive device disposed between the blocker holder and the blocker to push the blocker toward the extraction plate.

13. A workpiece processing system, comprising:
    an ion source chamber, comprising a plurality of chamber walls and an extraction plate with an extraction aperture;
    wherein the extraction plate has a front surface facing away from the ion source chamber and a rear surface disposed in the ion source chamber, and wherein the front surface is devoid of any attachment components.

14. The workpiece processing system of claim 13, wherein the extraction plate comprises two sidewalls extending away from the front surface, the two sidewalls each having a hole.

15. The workpiece processing system of claim 14, further comprising a mating component having raised sidewalls, the raised sidewalls each having a hole, and a plurality of pins, each pin passing through the hole in one of the two sidewalls and a respective hole in the raised sidewalls.

16. The workpiece processing system of claim 15, wherein an ion source housing surrounds at least a portion of the ion source chamber, and wherein a mounting frame is attached to the ion source housing and the mounting frame is the mating component.

17. The workpiece processing system of claim 15, wherein an ion source housing surrounds at least a portion of the ion source chamber, wherein the ion source housing is the mating component.

18. The workpiece processing system of claim 15, further comprising an O-ring disposed between the mating component and the extraction plate to create thermal isolation between the mating component and the extraction plate.

19. The workpiece processing system of claim 18, wherein the O-ring pushes the extraction plate away from the mating component which holds the plurality of pins in place.

* * * * *